United States Patent
Chikada (10) Patent No.: US 8,365,133 B2
(45) Date of Patent: Jan. 29, 2013

(54) TESTING APPARATUS, TESTING METHOD, AND PROGRAM

(75) Inventor: Shinichiro Chikada, Kanagawa (JP)

(73) Assignee: Sony Corporation, Tokyo (JP)

( * ) Notice: Subject to any disclaimer, the term of this patent is extended or adjusted under 35 U.S.C. 154(b) by 403 days.

(21) Appl. No.: 12/710,581

(22) Filed: Feb. 23, 2010

(65) Prior Publication Data

US 2010/0229039 A1   Sep. 9, 2010

(30) Foreign Application Priority Data

Mar. 4, 2009   (JP) ................. 2009-050278

(51) Int. Cl.
*G06F 17/50* (2006.01)
(52) U.S. Cl. .................. 716/136; 716/101; 716/113
(58) Field of Classification Search .................. 716/101, 716/113, 136
See application file for complete search history.

(56) References Cited

U.S. PATENT DOCUMENTS 5,619,512 A * 4/1997 Kawashima et al. .......... 714/733
5,982,681 A * 11/1999 Schwarz ....................... 365/201

FOREIGN PATENT DOCUMENTS

| JM | 2005-165747 A | 6/2005 |
|---|---|---|
| JP | 10-283388 | 10/1998 |
| JP | 2001-167141 A | 6/2001 |
| JP | 2001-349932 A | 12/2001 |
| JP | 2006-058172 A | 3/2006 |
| JP | 2007-047109 A | 2/2007 |

* cited by examiner

*Primary Examiner* — Thuan Do
(74) *Attorney, Agent, or Firm* — Wolf, Greenfield & Sacks, P.C.

(57) ABSTRACT

A testing apparatus includes a vector memory unit storing original test vector data in which an input signal to be inputted to a circuit subjected to inspection is described, a vector generator generating generated test vector data from the original test vector data, an output part outputting test vector data to be inputted to the inspected circuit, a fault occurrence rate memory unit storing a fault occurrence rate of the input signal, a random number generator generating random number data, and a comparison part comparing the fault occurrence rate of the input signal with the random number data. The vector output part outputs the generated test vector data when the random number data is smaller than the fault occurrence rate of the input signal, and outputs the original test vector data when the random number data is larger than the fault occurrence rate of the input signal.

6 Claims, 8 Drawing Sheets

| SIGNAL NAME | FAULT OCCURRENCE RATE |
|---|---|
| vsync | 0.0000001 (0.00001%) |
| hsync | 0.0000001 (0.00001%) |
| ⋮ | ⋮ |

| SIGNAL NAME | STANDARD TEST VECTOR DATA | |
|---|---|---|
| vsync | 001000000 ⋯ 0000 | 5 |
| hsync | 001000000001000 | |
| | ⋮ | |

FIG. 6

| SIGNAL NAME | STANDARD TEST VECTOR DATA |
|---|---|
| vsync | 000000000 ⋯ 0000 |
| hsync | 001000000000000 |
| | ⋮ |

FIG. 7

(3, vsync)  
(12, hsync)  
⋮    18

| SIGNAL NAME | FAULT OCCURRENCE RATE 1 | FAULT OCCURRENCE RATE 2 |
|---|---|---|
| vsync | 0.0000001 (0.00001%) | |
| hsync | 0.0000001 (0.00001%) | 1.0 (100%) |
| ⋮ | ⋮ | ⋮ |

TESTING APPARATUS, TESTING METHOD, AND PROGRAM

BACKGROUND OF THE INVENTION

1. Field of the Invention

The present invention relates to a testing apparatus, a testing method, and a program that test a circuit subjected to inspection using test vector data in which an input signal to be inputted to the circuit subjected to inspection is described.

2. Description of the Related Art

In recent years, systems using electronic circuits are advanced with higher functions and more complexity. Consequently, hardware mounted in such a system has a larger circuit scale and increased complexity. In system design, verification of hardware and software is very important to ensure that a system behaves as specified.

In hardware design, verification of the functions occupies most of the design period. As the scale and complexity of the circuits increase, the number of person-hours for such verification of the functions is also increasing. With such a background, measures to shorten the verification of the functions are considered. Exemplary methods of shortening the verification period include a method of shortening the verification period by speedup of hardware simulations and a method of generating test vector data at random.

The techniques of test vector creation and verification related to test vectors are disclosed in Japanese Unexamined Patent Application Publication Nos. 2001-167141, 2006-58172, and 2007-47109.

Japanese Unexamined Patent Application Publication No. 2001-167141 discloses a fault simulator. This fault simulator executes a fault simulation of an integrated circuit having different component portions activated in correspondence with the operation mode, and classifies the test vectors based on circuit design data. The simulator then carries out a fault simulation of an integrated circuit per operation mode using the classified test vectors.

Japanese Unexamined Patent Application Publication No. 2006-58172 discloses a test pattern generation program. This test pattern generation program generates terminal information of a circuit based on a netlist, selects an activation test sequence that activates a terminal of the generated terminal information, and generates a test sequence using this activation test sequence.

In Japanese Unexamined Patent Application Publication No. 2007-47109, information included in test data, such as signal information, is classified into each type to create intermediate data and fail information is added to the intermediate data to create test data for fault analysis.

In such a manner, in Japanese Unexamined Patent Application Publication Nos. 2001-167141, 2006-58172, and 2007-47109, test vectors are created using circuit information, fault information, and the like or suitable test vectors are selected using circuit information, fault information, and the like.

SUMMARY OF THE INVENTION

In actual production sites, verification of hardware functions is often carried out by combining verification with test vector data and verification with random vector data.

In the verification with test vector data, the designer creates the vectors. It is thus possible to create test vector data of good quality, high in the possibility to detect a hardware defect and suitable for the circuit subjected to verification, for verification.

However, in a case of creating the test vector data manually, it takes time and efforts to create the test vector data. As a result, it is extremely difficult to create sufficient test vector data in a short design period. It is also difficult to verify with vector data other than the created test vector data.

On the other hand, in the verification with random vector data, since random vector data is generated not manually, it does not take time to create the vector data.

However in random vector data, vector data items are included that are not probably created as the test vector data by manual. In the verification with random vector data, the number of vector data to be verified thus increases and the simulation period turns out to be longer than that of the verification with test vector data.

As a result, in actual production sites, even if hardware functions are verified by combining the verification with test vector data and the verification with random vector data, it is difficult to complete sufficient verification of hardware functions in a short period of time.

It is desirable to provide a testing apparatus, a testing method, and a program that can shorten the verification period by improving the efficiency of the verification of hardware functions.

A testing apparatus according to an embodiment of the present invention includes a vector memory unit storing original test vector data in which an input signal to be inputted to a circuit subjected to inspection is described, a vector generator generating, from the original test vector data stored in the vector memory unit, generated test vector data different from the original test vector data, an output part outputting test vector data to be inputted to the circuit subjected to inspection, a fault occurrence rate memory unit storing a fault occurrence rate of the input signal described in the original test vector data, a random number generator generating random number data, and a comparison part comparing the fault occurrence rate of the input signal stored in the fault occurrence rate memory unit with the random number data. The vector output part outputs the generated test vector data in a case that the random number data is smaller than the fault occurrence rate of the input signal, and outputs the original test vector data in a case that the random number data is larger than the fault occurrence rate of the input signal.

Preferably, the testing apparatus may further include a program memory unit storing a conversion program in which a conversion rule is described to generate verification test vector data, in which an input signal different from the standard input signal that can be inputted to the circuit subjected to inspection is described, from the standard test vector data in which the standard input signal to be inputted to the circuit subjected to inspection is described. The vector generator may execute the conversion program to generate the generated test vector data from the original test vector data.

A testing method according to another embodiment of the present invention includes the steps of reading original test vector data, in which an input signal to be inputted to a circuit subjected to inspection is described, from a memory unit storing the original test vector data, generating random number data, reading a fault occurrence rate of the input signal corresponding to the read original test vector data from a memory unit storing the fault occurrence rate of the input signal described in the original test vector data, comparing the generated random number data with the read fault occurrence rate of the input signal, generating generated test vector data, different from the original test vector data, from the read original test vector data, and outputting test vector data to be inputted to the circuit subjected to inspection. In a case that the random number data is smaller than the fault occurrence rate of the input signal in the comparing step, the generated test vector data is generated by the generating step and the generated test vector data generated by the generating step is outputted in the outputting step, and in a case that the random number data is larger than the fault occurrence rate of the input signal in the comparing step, the original test vector data is outputted in the outputting step.

A program according to still another embodiment of the present invention makes a computer having a memory unit and a process circuit and functioning as a testing apparatus to test a circuit subjected to inspection to execute a procedure for reading original test vector data that is stored in the memory unit and in which an input signal to be inputted to the circuit subjected to inspection is described from the memory unit, a procedure for generating random number data, a step of reading a fault occurrence rate, stored in the memory unit and described in the original test vector data, of the input signal from the memory unit, a procedure for comparing the generated random number data with the read fault occurrence rate of the input signal, a procedure for generating generated test vector data, different from the original test vector data, from the read original test vector data, and a procedure for outputting test vector data to be inputted to the circuit subjected to inspection. In a case that the random number data is smaller than the fault occurrence rate of the input signal in the comparing procedure, the generated test vector data is made to be generated with the generating procedure, and the generated test vector data generated with the generating procedure is made to be outputted in the outputting procedure, and in a case that the random number data is larger than the fault occurrence rate of the input signal in the comparing procedure, the original test vector data is made to be outputted in the outputting procedure.

In the three embodiments above, the test vector data is generated from the original test vector data. Therefore, a user does not have to generate all test vector data used for verification. The period to generate the test vector data by a user can be thus shortened.

Moreover, in the three embodiments above, each original test vector data item is converted to the generated test vector data with a probability of a fault occurrence in an input signal corresponding to each item. That is, in the three embodiments above, it is possible to test an input signal described in the original test vector data for the situation of fault occurrence with the fault occurrence probability of the signal.

Also in the three embodiments above, the generated test vector data is generated by converting the original test vector data. That is, the randomness of the generated vector data is limited. Therefore, as in a case of the verification with random vector data, an increase in automatically generated vector data is suppressed.

In the embodiments of the present invention, the verification period can be shortened by improving the effectiveness of the verification of hardware functions.

BRIEF DESCRIPTION OF THE DRAWINGS

FIGS. 3A and 3B illustrate one example of the sequence definition file group of FIG. 2, where FIG. 3A is a fault occurrence rate table and FIG. 3B is conversion programs for each input signal;

FIGS. 9A and 9B illustrate one example of the sequence definition file group of FIG. 8, where FIG. 9A is a fault occurrence rate table and FIG. 9B is conversion programs for each input signal.

DESCRIPTION OF THE PREFERRED EMBODIMENTS

A description is given below to embodiments of the present invention with reference to the drawings in the following order:
1. Embodiment (Example of generating test vector data by converting original test vector with fault occurrence probability for each input signal for verification)
2. Another Embodiment (Example of changing fault occurrence probability of input signal in correspondence with fault occurrence of another input signal)<

Embodiment

[Configuration of Testing Apparatus]

A testing apparatus according to an embodiment of the present invention simulates a circuit description program in which a circuit subjected to inspection (DUT: design under test) is described to inspect functions of the circuit. The testing apparatus can convert test vector data created by a user in simulation of a circuit description program with a fault occurrence probability of a signal to execute simulation.

The circuit description program may be a program in which a circuit subjected to inspection is described.

As such a circuit description program, there is a hardware model program described in RTL (register transfer level), for example.

Other than that, the circuit description program may also be a hardware model program described at a gate level lower than the RTL in the level of abstraction or a program described at an operation level higher than the RTL in the level of abstraction.

The program language to describe a circuit may be a description language, for example, Verilog, VHDL, a language that can describe a circuit at an operation level, such as System C, and the like.

The test vector data is data in which an input signal to be inputted to the circuit subjected to inspection is described. As exemplified in FIG. 5 described later, the test vector data is data in which the waveform of the input signal is described in a data array of 0 (low level) and 1 (high level).

Figure 1:
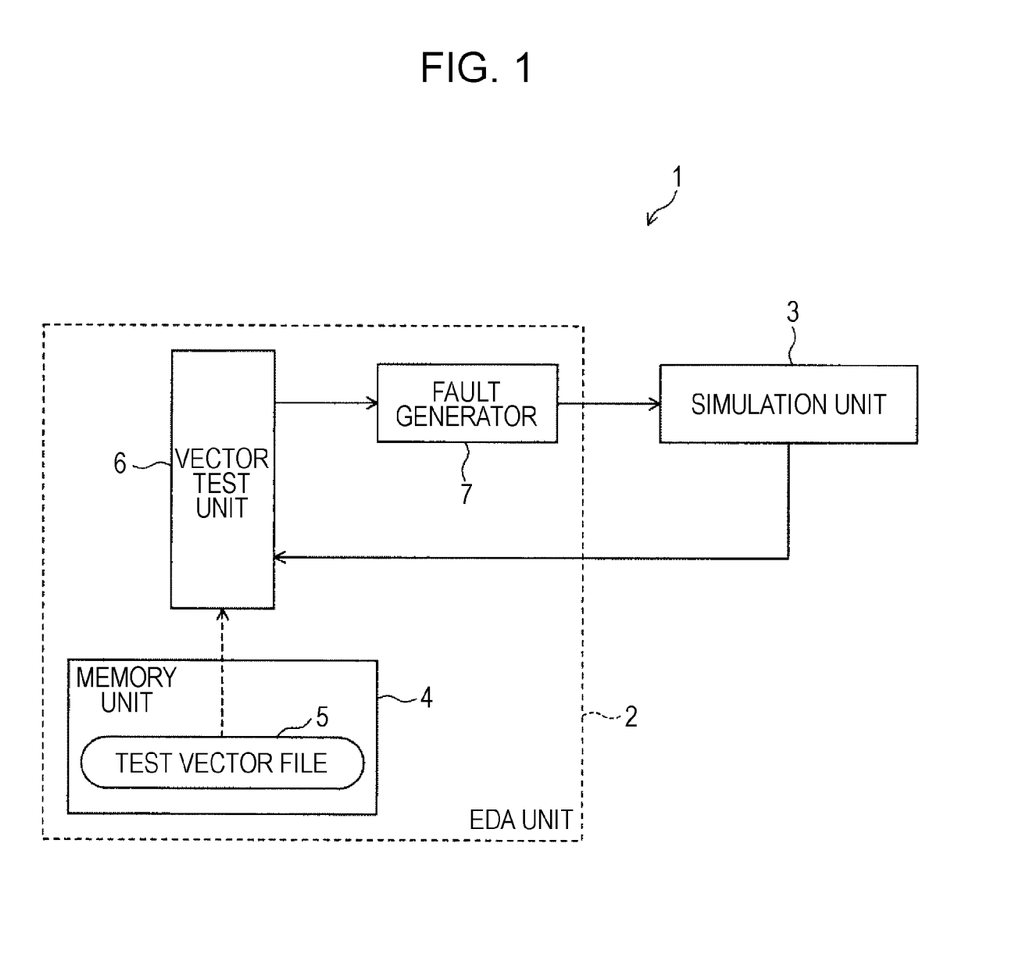
FIG. 1 is a schematic configuration diagram illustrating a testing apparatus according to an embodiment of the present invention.
Figure 2:
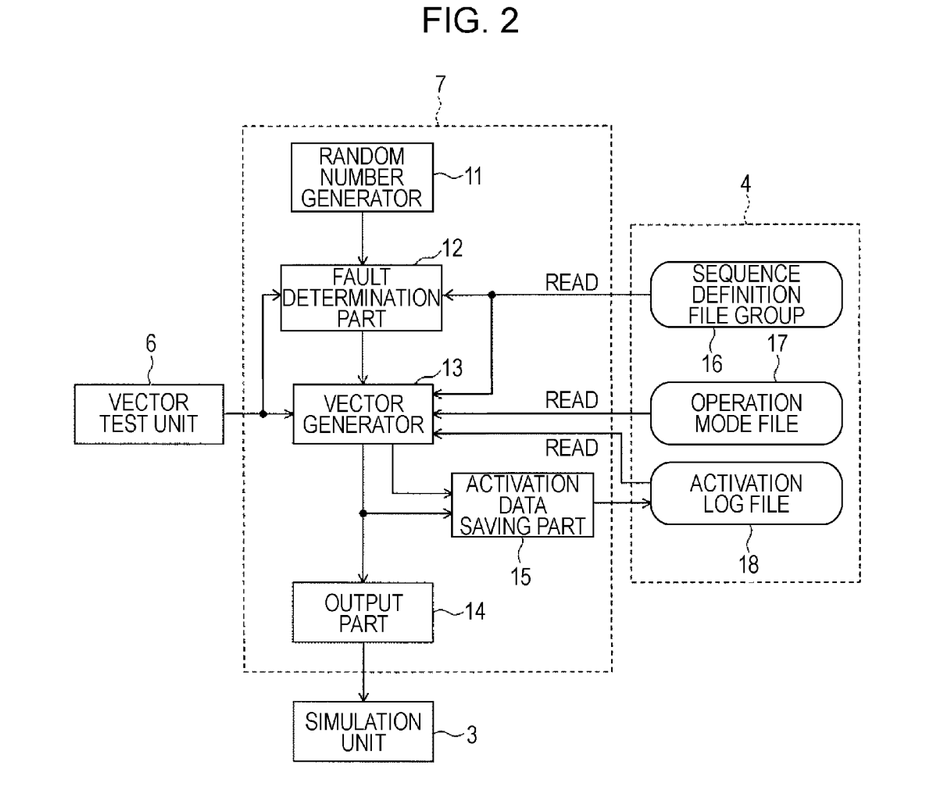
FIG. 2 is a detailed schematic configuration diagram of the testing apparatus of FIG. 1.

FIG. 1 is a schematic configuration diagram illustrating a testing apparatus 1 according to the embodiment. FIG. 2 is a detailed configuration diagram of the testing apparatus 1 in FIG. 1.

The testing apparatus 1 in FIG. 1 can be provided in such a manner that, in a computer having a memory unit, an input unit, an output part, and a process circuit connected to them, the process circuit executes a program stored in the memory unit. In this case, the process circuit executes processes for various functions illustrated in FIGS. 1 and 2. The program to provide the testing apparatus 1 in the computer may be recorded in a computer readable recording medium, such as a CD-ROM (compact disc read-only memory), and installed in the computer. The program may also be downloaded from a server through a transmission medium, such as a network, and installed in the computer.

The testing apparatus 1 in FIG. 1 has an EDA (electronic design automation) unit 2 and a simulation unit 3. The EDA unit 2 further has a memory unit 4, a vector test unit 6, and a fault generator 7. The EDA unit 2 outputs a test vector to the simulation unit 3.

The simulation unit 3 executes a circuit description program using the test vector data as input data for the circuit description program. The circuit description program may be stored in, for example, the memory unit 4.

With simulation using the test vector data, the simulation unit 3 virtually simulates circuit behaviors in a case of giving an input signal to the circuit subjected to inspection. By this simulation, the simulation unit 3 then obtains output data of the execution result of the circuit description program. The output data corresponds to data in which an output signal of the circuit subjected to inspection is described. The simulation unit 3 outputs the output data of the simulation to the vector test unit 6 of the EDA unit 2.

The memory unit 4 of the EDA unit 2 stores a test vector file 5. In the test vector file 5, test vector data is stored that is created by a user in correspondence with a circuit to be verified. Such test vector data included in the test vector file 5 is referred to below as original test vector data in a case of particularly distinguishing from generated test vector data described later.

Figure 5:
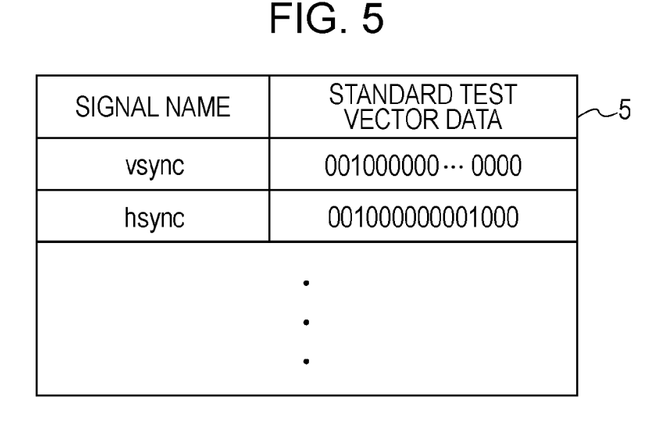
FIG. 5 illustrates one example of a data structure of the test vector file of FIG. 1.

FIG. 5 illustrates one example of the data structure of the test vector file 5. In the test vector file 5, test vector data is included in which an input signal to be inputted to the circuit subjected to inspection is described. The test vector data is associated with a name of an input signal described therein.

The test vector file 5 in FIG. 5 includes test vector data of a vertical synchronization signal vsync and test vector data of a horizontal synchronization signal hsync included in a television signal. The test vector data of the vertical synchronization signal vsync includes a data array of 001000000 . . . 0000. The third data bit 1 indicates a vertical synchronization pulse of the vertical synchronization signal vsync. The test vector data of the horizontal synchronization signal hsync includes a data array of 001000000001000. The third data bit 1 and the twelfth data bit 1 indicate horizontal synchronization pulses of the horizontal synchronization signal hsync.

The test vector data included in the test vector file 5 may be standard test vector data created by a user. The standard test vector data means test vector data composed of a data array in which a standard waveform of an input signal to be inputted to the circuit subjected to inspection is described with 0 and 1.

The vector test unit 6 reads the test vector data from the test vector file 5. The vector test unit 6 also outputs the read test vector data to the fault generator 7. Therefore, the test vector data included in the test vector file 5 is to be outputted to the simulation unit 3 via the fault generator 7.

In a general EDA unit 2 without a fault generator 7, the vector test unit 6 outputs the test vector data directly to the simulation unit 3. In such a manner, the test vector data included in the test vector file 5 is data that can be utilized directly for the simulation in the simulation unit 3.

As illustrated in FIG. 2, the fault generator 7 has a random number generator 11, a fault determination part 12, a vector generator 13, an output part 14, and an activation data saving part 15. The fault generator 7 uses a sequence definition file group 16, an operation mode file 17, and an activation log file 18. These files are stored in the memory unit 4.

Figure 3A:
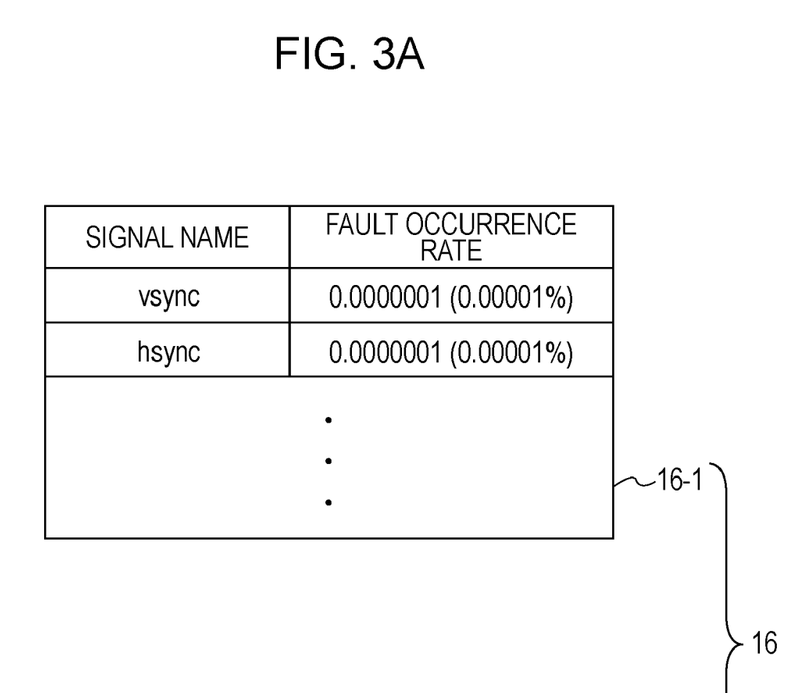
Figure 3B:
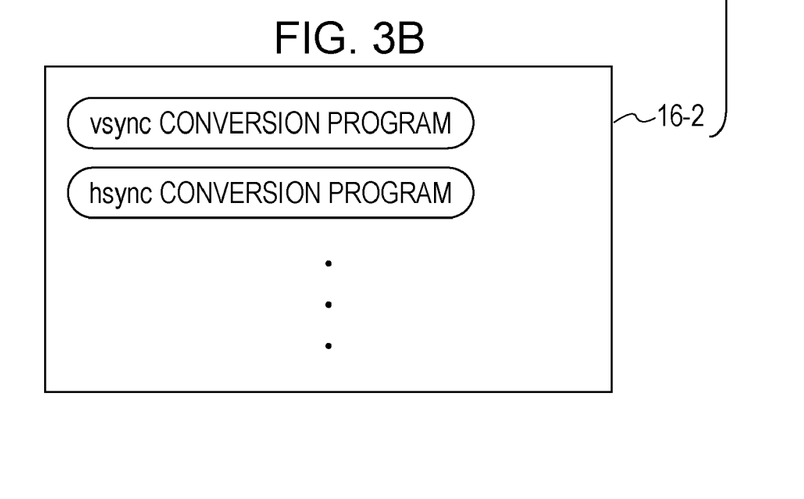

FIGS. 3A and 3B illustrate one example of the sequence definition file group 16. The sequence definition file group 16 includes a fault occurrence rate table 16-1 in FIG. 3A and a plurality of conversion programs 16-2 for each input signal in FIG. 3B.

As illustrated in FIG. 3A, the fault occurrence rate table 16-1 has values of fault occurrence rates (%) of the plurality of input signals inputted to the circuit subjected to inspection. The value of the fault occurrence rate of each input signal is associated with the name of the input signal.

The fault occurrence rates (%) of the input signals may be what illustrate the ratio of errors in the input signals that can actually be occurred in correspondence with the communication environment and the like. For example, in a case of a circuit to receive television airwaves, they may be the fault occurrence rate (%) of occurrence in the vertical synchronization signal and the fault occurrence rate (%) of occurrence in the horizontal synchronization signal. The example in FIG. 3A is an example of a case that the vertical synchronization signal vsync does not become the high level with a probability of 0.00001. The example is also an example of a case that the horizontal synchronization signal hsync does not become the high level with a probability of 0.00001.

The conversion programs 16-2 for each input signal illustrated in FIG. 3B are programs to convert the original test vector data to generate test vector data different from the original test vector data.

Specifically, for example, the conversion programs 16-2 may be programs to convert the standard test vector data in which a standard input signal is described to verification test vector data different from the standard test vector data. Using such verification test vector data in, for example, a circuit to be inputted with communication data or the like enables to verify the behaviors when the communication is failed.

The conversion programs 16-2 may be described in, for example, C language, C+ language, System C, VHDL, or Verilog. The conversion programs 16-2 may also be provided in hardware for exclusive use.

Here, the verification test vector data means test vector data in which the waveforms of input signals to be possibly and actually inputted to the circuit subjected to inspection are described and also test vector data different from the standard test vector data in which standard waveforms are described.

As the waveforms of input signals to be possibly and actually inputted to the circuit subjected to inspection, other than the standard waveforms, there are waveforms having the pulse width, the position, or the size changed from the pulses included in the standard waveforms, for example. Still other than that, there are also waveforms, for example, in a case of not having an input signal to be inputted thereto.

Then, in a case of verifying the case that, for example, an input signal is not inputted to the circuit subjected to verification, the conversion programs 16-2 may be a program to convert all the values of the test vector data to 0.

Yet other than that, in a case of verifying the case that, for example, the position of a pulse included in an input signal is shifted, the conversion programs 16-2 may be a program to transfer the position of bit data 1 in the test vector data backward and forward in the data array.

The operation mode file 17 includes data showing the operation mode of the fault generator 7. The fault generator 7 has the operation modes of a normal mode and a reproduction mode.

The normal mode is a mode to convert the original test vector data inputted from the vector test unit 6 to generate new test vector data.

The reproduction mode is, as described later, a mode to convert the original test vector data using activation data regardless of the random number generation result and the fault determination result to reproduce the test vector data generated previously. This enables to reproduce the time and the contents of changes in the test vector data generated previously and to reproduce the simulation carried out previously.

The data stored in the memory unit 4, such as the values of the operation mode file 17, can be modified by an input unit not shown in response to a user operation.

The random number generator 11 generates random number data of real number values (finite values) within a range of from 0 to 1.

The random number data may be generated by, for example, Mersenne twister or a random function rand( ) of the linear congruential method.

Other than those, the random number data may also use, for example, a random number generator, such as /dev/random, prepared by the operating system to obtain real number values (finite values) within a range of from 0 to 1.

The random function rand( ) of the linear congruential method generates a random number array in which, once a seed is fixed, the plurality of random number values after that become the same. In contrast, /dev/random extracts an input value of an input device or the like to generate random number values, and thus completely random numbers are generated.

The random number generator 11 outputs the generated random number data to the fault determination part 12.

The fault determination part 12 compares the random number data generated by the random number generator 11 with the fault occurrence rate stored in the fault occurrence rate table 16-1. The fault determination part 12 then judges that a fault occurs in a case that the random number data is smaller than the fault occurrence rate and judges that no fault occurs in a case that the random number data is not less than the fault occurrence rate. The fault determination part 12 outputs data showing the result of the judgment whether or not a fault is occurred to the vector generator 13.

The vector generator 13 selects test vector data to be outputted in correspondence with the operation mode and the result of the judgment whether or not a fault is occurred.

The vector generator 13 also generates test vector data from the test vector data inputted to the fault generator 7. The data array of the generated test vector data is different from the data array of the original test vector data inputted to the fault generator 7. The test vector data generated by the vector generator 13 is referred to below as generated test vector data.

Specifically, the vector generator 13 executes the conversion programs 16-2 for each input signal in FIG. 3B in a case of the normal mode to generate the generated test vector data from the inputted original test vector data.

Figure 6:
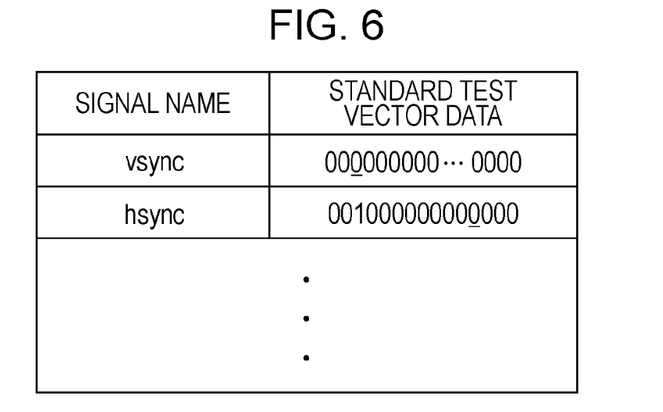
FIG. 6 illustrates one example of a data structure of a test vector file generated by the vector generator of FIG. 2.

The vector generator 13 generates verification test vector data in FIG. 6 from, for example, the original standard test vector data illustrated in FIG. 5. In the verification test vector data in FIG. 6, the third data piece in the vertical synchronization signal vsync is modified from 0 to 1. Also, the twelfth data piece in the horizontal synchronization signal hsync is modified from 0 to 1.

In a case of the reproduction mode, the vector generator 13 generates generated test vector data from the inputted original test vector data using difference data of the activation log file 18 in FIG. 5 described later.

The vector generator 13 then outputs the selected test vector data to the output part 14. In a case of generating the test vector data, the vector generator 13 outputs the generated test vector data and the original test vector data to the activation data saving part 15.

The output part 14 outputs the test vector data selected by the vector generator 13 to the simulation unit 3.

The activation data saving part 15 accumulates activation data for reproduction of the test vector data generated by the vector generator 13 in the activation log file 18.

FIG. 5 illustrates one example of the activation log file 18. In the activation log file 18, the activation data (reproduction data) for reproduction of the generated test vector data generated by the vector generator 13 is accumulated. In the example of FIG. 5, in the activation log file 18, data of the difference between the original test vector data inputted to the vector generator 13 and the generated test vector data generated by the vector generator 13 is accumulated. Specifically, the difference data showing that the third data piece in the vertical synchronization signal vsync is modified and the difference data showing that the twelfth data piece in the horizontal synchronization signal hsync is modified are accumulated.

[Behavior of Testing Apparatus]

Figure 4:
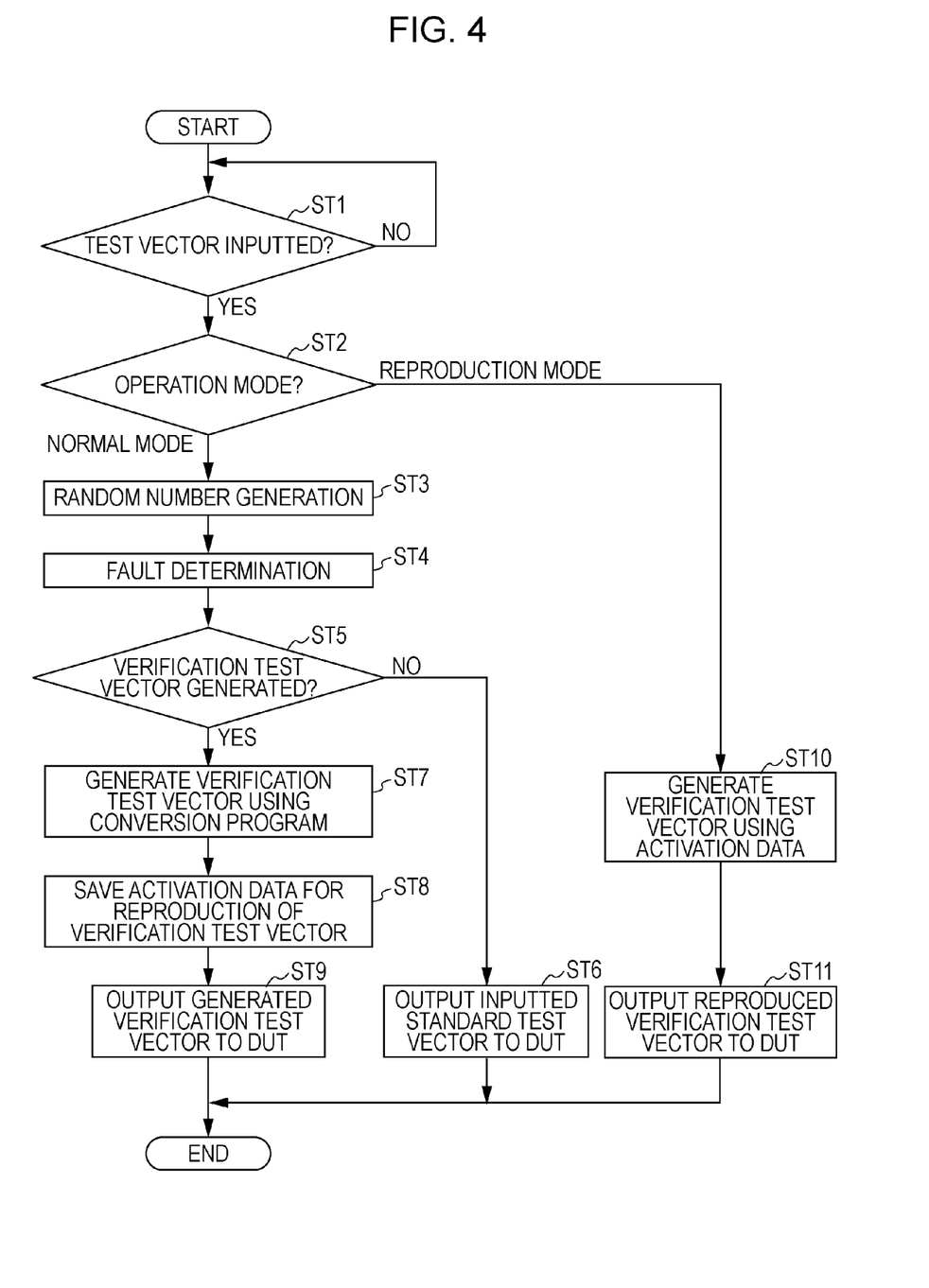
FIG. 4 is a flowchart illustrating a flow of a test vector data generation process by the testing apparatus of FIG. 1.
Figure 7:
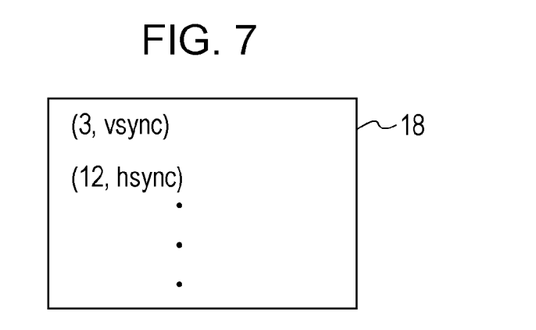
FIG. 7 illustrates one example of a data structure of the activation log file of FIG. 2.

FIG. 4 is a flowchart illustrating a flow of behaviors in the testing apparatus 1 in FIG. 1 until the test vector data is outputted to the simulation unit 3. FIG. 5 illustrates one example of the standard test vector data stored in the test vector file 5. FIG. 6 illustrates one example of the verification test vector data generated by the vector generator 13 based on the standard test vector data in FIG. 5. FIG. 7 illustrates one example of the activation data stored in the activation log file 18 in a case of generating the verification test vector data in FIG. 6 based on the standard test vector data in FIG. 5.

In a state of the standard test vector data of FIG. 5 created by a user being stored in the test vector file 5 of FIG. 1, the vector test unit 6 reads the standard test vector data of each signal name from the test vector file 5 for output. In a case of FIG. 5, the vector test unit 6 firstly reads the standard test vector data of the vertical synchronization signal vsync for output. With that, the fault generator 7 executes the flowchart in FIG. 4.

When the test vector is inputted to the fault generator 7 (step ST1), the vector generator 13 reads the currently set operation mode from the operation mode file 17 (step ST2).

In a case that the read operation mode is the normal mode, the fault determination part 12 obtains random number data from the random number generator 11. The random number generator 11 generates the random number data having values within a range of from 0 to 1 (step ST3).

When the random number data is inputted, the fault determination part 12 reads the value of the fault occurrence rate of the input signal corresponding to the inputted test vector data from the fault occurrence rate table 16-1 in FIG. 3A of the sequence definition file group 16 in order to judge a fault. In a case that the standard test vector data of the vertical synchronization signal vsync is inputted, the fault determination part 12 reads the fault occurrence rate of 0.00001% associated with the name of the signal vsync (step ST4).

Next, the fault determination part 12 compares the value of the random number data with the fault occurrence rate. In a case that the value of the random number data is smaller than the value of the fault occurrence rate, the fault determination part 12 then judges that a fault occurs. On the contrary, in a case that the value of the random number data is not less than the value of the fault occurrence rate, the fault determination part 12 judges that no fault occurs. The fault determination part 12 outputs the result of the judgment whether or not a fault occurs to the vector generator 13.

When the result of the judgment whether or not a fault occurs is inputted, the vector generator 13 judges process contents based on the inputted result of the judgment whether or not a fault occurs (step ST5).

For example, in a case that the fault determination part 12 determines that no fault occurs (a case of judging as No in step ST5), the vector generator 13 outputs the test vector data inputted from the vector test unit 6 directly to the output part 14 (step ST6). As a result, the output part 14 outputs the test vector data stored in the memory unit 4 to the simulation unit 3. In a case of FIG. 5, the output part 14 outputs the standard test vector data of the vertical synchronization signal vsync to the simulation unit 3.

In the test vector file 5 of FIG. 5, other than the standard test vector data of the vertical synchronization signal vsync, the standard test vector data of the horizontal synchronization signal hsync is also included. Thus, the vector test unit 6 then reads the standard test vector data of the horizontal synchronization signal hsync to output to the fault generator 7. The fault generator 7 executes the processes in FIG. 4 described above. In a case that the fault determination part 12 determines again that no fault occurs (a case of judging as No in step ST5), the output part 14 of the fault generator 7 then outputs the standard test vector data of the horizontal synchronization signal hsync stored in the memory unit 4 to the simulation unit 3 (step ST6).

When predetermined test vector data is inputted, the simulation unit 3 executes a circuit description program using the inputted test vector data as an input. The simulation unit 3 also outputs output data generated as a result of the simulation to the vector test unit 6. The vector test unit 6 saves, for example, the output data in the memory unit 4. The vector test unit 6 also compares the output data with predetermined expectation data not shown to save the result of the comparison (agreement or disagreement) in the memory unit 4.

Based on the output data or the result of the comparison stored in the memory unit 4, the user can judge whether or not the circuit of the verified circuit description program can provide a desired function in a case of inputting a standard input signal. In a case that it is difficult to provide the desired function, the user can correct the circuit description program and repeat the verification.

Other than that, in step ST5 in FIG. 4 for example, in a case that the fault determination part 12 determines that a fault occurs (Yes), the vector generator 13 starts a process of generating test vector data (step ST7).

In a process of generating test vector data in the normal mode, the vector generator 13 firstly reads the conversion programs 16-2 in FIG. 3B of the sequence definition file group 16. Next, the vector generator 13 executes the read conversion programs 16-2 and converts the test vector data inputted from the vector test unit 6 to generate test vector data. For example, in a case that the conversion programs 16-2 are programs verifying the state of no input signal being inputted, the vector generator 13 generates verification test vector data in which all data pieces 1 included in the standard test vector data are replaced with data pieces 0.

Then, the vector generator 13 outputs the inputted standard test vector data and the generated verification test vector data to the activation data saving part 15 (step ST8). Firstly, the activation data saving part 15 subtracts, for example, the verification test vector data from the standard test vector data to generate difference test vector data. The activation data saving part 15 then generates difference data showing the position, in the vector data, of disparity bit data appeared in the difference test vector data to save the difference data in the activation log file 18. In a case of the vertical synchronization signal vsync in FIGS. 5 and 6, as illustrated in FIG. 7, the difference data of (3, vsync) is saved in the activation log file 18.

The vector generator 13 also outputs the generated test vector data to the output part 14 (step ST9). The output part 14 outputs the test vector data inputted from the vector generator 13 to the simulation unit 3.

Subsequently, the vector test unit 6 reads the standard test vector data of the horizontal synchronization signal hsync to output to the fault generator 7. With that, the fault generator 7 repeatedly executes the processes in FIG. 4 described above.

In a case that the fault determination part 12 determines again that a fault occurs (Yes) in step ST5, the vector generator 13 of the fault generator 7 then outputs the verification test vector data and the standard test vector data to the activation data saving part 15 (step ST8). The activation data saving part 15 then generates difference data showing the position, in the vector data, of disparity bit data appeared in the difference test vector data to save the difference data in the activation log file 18. In a case of the horizontal synchronization signal hsync in FIGS. 5 and 6, as illustrated in FIG. 7, the difference data of (12, vsync) is saved in the activation log file 18.

The vector generator 13 also converts the standard test vector data of the inputted horizontal synchronization signal hsync using the conversion programs 16-2 read from the sequence definition file group 16 (step ST9). The vector generator 13 also outputs the newly generated verification test vector data to the activation data saving part 15 and the simulation unit 3.

With the above processes, in this example, the verification test vector data of the vertical synchronization signal vsync illustrated in FIG. 6 and the verification test vector data of the horizontal synchronization signal hsync are inputted to the simulation unit 3. The simulation unit 3 executes the circuit description program using the plurality of inputted verification test vector data items as data for the input signals. The simulation unit 3 outputs the output data generated as a result of the execution to the vector test unit 6. The vector test unit 6 saves the output data in the memory unit 4. The vector test unit 6 also compares the output data with expectation data not shown to save the result of the comparison (agreement or disagreement) in the memory unit 4.

The user can judge whether or not the circuit of the verified circuit description program provides a desired function in a case that a signal different from a standard input signal is inputted based on the output data or the result of the comparison stored in the memory unit 4. In a case that it is difficult to provide the desired function, the user can correct the circuit description program.

Furthermore, in step ST2 in FIG. 4 for example, in a case that the operation mode is judged as the reproduction mode, the vector generator 13 starts a process of generating test vector data in the reproduction mode. The vector generator 13 starts a process to reproduce the test vector data same as the verification test vector data generated in the past (step ST10).

In the process of generating test vector data in the reproduction mode, the vector generator 13 firstly reads the difference data from the activation log file 18. Next, the vector generator 13 modifies the standard test vector data inputted from the vector test unit 6 using the read difference data to generate reproduced verification test vector data. For example, in a case of the activation log file 18 in FIG. 7, the vector generator 13 modifies the third data bit to 1 in the test vector data of the vertical synchronization signal vsync and modifies the twelfth data bit to 1 in the test vector data of the horizontal synchronization signal hsync. With that, the verification test vector data in FIG. 6 is reproduced.

The vector generator 13 outputs the reproduced verification test vector data to the output part 14. The output part 14 outputs the test vector data inputted from the vector generator 13 to the simulation unit 3 (step ST11).

By repeatedly executing the above reproduction processes for the test vector data of the input signals, the reproduced verification test vector data of the vertical synchronization signal vsync and the reproduced verification test vector data of the horizontal synchronization signal hsync in FIG. 6, for example, are inputted to the simulation unit 3. The simulation unit 3 executes the circuit description program using the plurality of reproduced verification test vector data items as data for the input signals.

The simulation unit 3 also outputs output data generated as a result of the execution to the vector test unit 6. The vector test unit 6 saves the output data in the memory unit 4. The vector test unit 6 also compares the output data with expectation data not shown to save the result of the comparison (agreement or disagreement) in the memory unit 4.

Based on the output data or the result of the comparison stored in the memory unit 4, the user can confirm, for example, that the circuit of the circuit description program not being able to provide a desired function before correction is enabled to provide the desired function by the correction.

As above, in this embodiment, random number data is generated to output the generated verification test vector data to the circuit subjected to inspection in a case that the random number data is smaller than the fault occurrence rate of the input signal. In a case that the random number data is larger than the fault occurrence rate of the input signal, the standard test vector data is outputted to the circuit subjected to inspection.

Therefore, in this embodiment, the test vector data in which faults occur at the fault occurrence rate that is actually generated in the input signal can be inputted to the circuit subjected to verification.

In this embodiment, the vector generator 13 generates the verification test vector data, different from the standard test vector data, from the standard test vector data in which a standard input signal inputted to the circuit subjected to inspection is described.

Particularly, in this embodiment, the verification test vector data is generated using the conversion programs 16-2 in which a conversion rule is described for generation of the verification test vector data from the standard test vector data in which a standard input signal is described.

Therefore, the generated verification test vector data becomes test vector data including faults within a range limited by the standard test vector data. The generated verification test vector data becomes test vector data approximated to the standard test vector data. The data faults included in the generated verification test vector data is limited to the signal faults actually occurred in the input signal. That is, the generated verification test vector data becomes test vector data suitable for circuit verification.

For that reason, the verification test vector data generated by the vector generator 13 in this embodiment does not become vector data that is not probably inputted to the circuit subjected to inspection as vector data randomly generated.

In this embodiment, generates the verification test vector data from the standard test vector data using the conversion programs 16-2. Therefore, in this embodiment, the verification test vector data can be generated based on a certain rule.

Thus, in this embodiment, test vector data in which, for example, a clock signal is described as the standard test vector data can be prepared and a program in which a conversion rule shifting the position of the clock pulse is described as the conversion program 16-2 for the clock signal can be used.

In such a manner, in this embodiment, shifting the position of the clock pulse enables to verify the portion to carry out clock switching in the circuit subjected to inspection.

Such clock switching occurs, for example in a case of implementing two circuits having different transmission rates in one semiconductor device, between the two circuits. Specifically, such clock switching may be generated in semiconductor devices handling communication packets in Ethernet®, semiconductor devices handling digital broadcast signals, and the like.

In this embodiment, a position of a data signal change can also be shifted similarly to the pulse position of the clock signal described above.

In this case, in the embodiment, test vector data in which the data signal is described may be prepared as the standard test vector data and a program may be used, in which a conversion rule to shift a position of a data signal change is described, as the conversion program 16-2 for the data signal.

Another Embodiment

[Configuration of Testing Apparatus]

Figure 8:
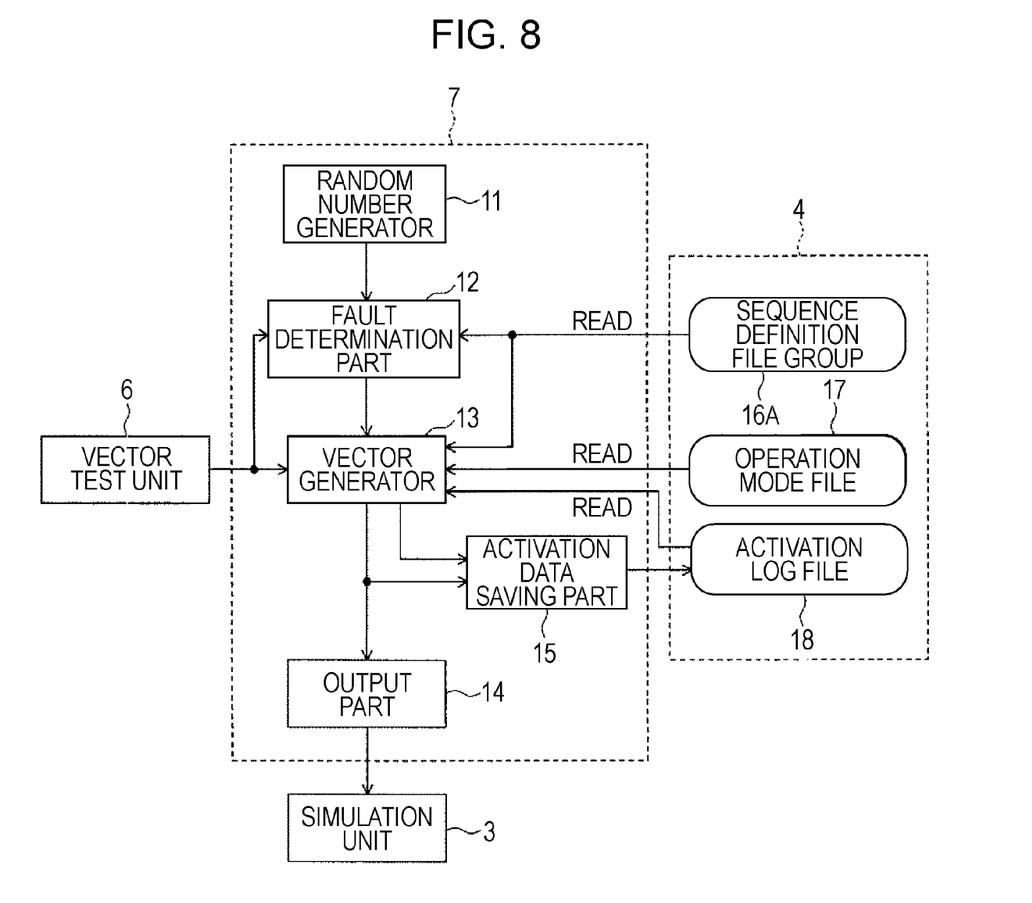
FIG. 8 is a schematic configuration diagram illustrating a testing apparatus according to another embodiment of the present invention.

FIG. 8 illustrates a configuration of a testing apparatus 1 of a circuit subjected to inspection according to another embodiment of the present invention. The testing apparatus 1 according to this embodiment is in common with the testing apparatus 1 according to the embodiment described earlier in terms of having a simulation unit 3 and an EDA unit 2 that includes a memory unit 4, a vector test unit 6, and a fault generator 7.

In a sequence definition file group 16A of the fault generator 7 in this embodiment, this testing apparatus 1 is however different from the testing apparatus 1 according to the embodiment described earlier in terms of including a fault occurrence rate table 16-1A that stores a plurality of fault occurrence probabilities varied in correspondence with faults occurred in another input signal.

Figure 9A:
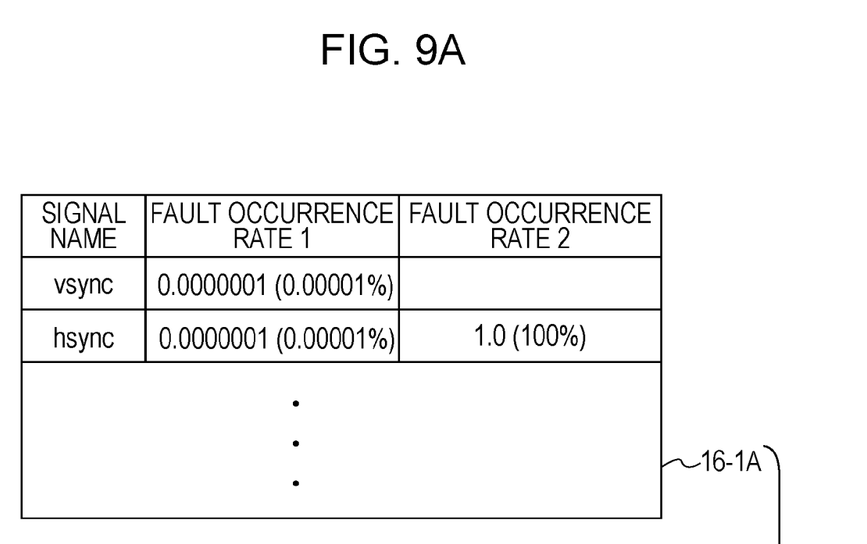
Figure 9B:
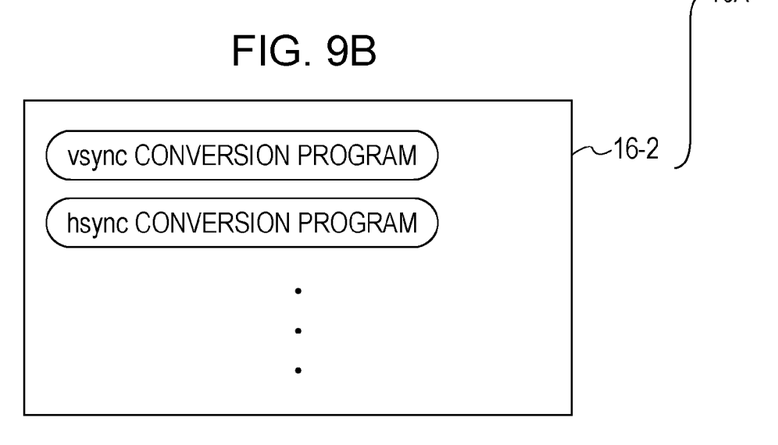

FIGS. 9A and 9B illustrate one example of the sequence definition file group 16A of FIG. 8. The fault occurrence rate table 16-1A of the sequence definition file group 16A has two fault occurrence rates for the horizontal synchronization signal hsync as illustrated in FIG. 9A. Among these two fault occurrence rates, a fault occurrence rate 1 on the left is a fault occurrence rate in a case that no fault occurs in the horizontal synchronization signal hsync. A fault occurrence rate 2 on the right is a fault occurrence rate in a case that a fault occurs in the horizontal synchronization signal hsync. The fault occurrence rate 2 on the right is higher in value (100%, in this example) than the fault occurrence rate 1 on the left.

In such a manner, in the fault occurrence rate table 16-1A of this embodiment, it is possible to describe the correlation between the plurality of input signals to be inputted to the circuit.

[Behavior of Testing Apparatus]

When the vector test unit 6 reads the standard test vector data of each signal name from the test vector file 5 and outputs the data to the fault generator 7 (step ST1), the fault generator 7 executes the flowchart in FIG. 4.

The vector generator 13 reads the currently set operation mode from the operation mode file 17 (step ST2).

In a case that the read operation mode is the normal mode, the fault determination part 12 obtains random number data from the random number generator 11. The random number generator 11 generates random number data to output to the fault determination part 12 (step ST3).

When the random number data is inputted, the fault determination part 12 reads the value of the fault occurrence rate of the input signal corresponding to the inputted test vector data from the fault occurrence rate table 16-1A in FIG. 9A of the sequence definition file group 16A. The fault determination part 12 also reads whether or not a fault occurs in another signal from the activation log file 18 (step ST4).

In a case of processing the horizontal synchronization signal hsync, for example, the fault determination part 12 reads the value of the fault occurrence rate 1 on the left in FIG. 9A when no fault occurs in the vertical synchronization signal vsync. When a fault occurs in the vertical synchronization signal vsync, it reads the value of the fault occurrence rate 2 on the right in FIG. 9A.

The fault determination part 12 then compares the value of the random number data with the fault occurrence rate to output a result of the judgment whether or not a fault occurs to the vector generator 13.

The behaviors of the vector generator 13 after step ST5 and the rest of the behaviors in the normal mode are same as those in the embodiment described earlier.

That is, in a case that no fault occurs in the normal mode (a case of No in step ST5) for example, the vector generator 13 selects the original standard test vector data read from the test vector file 5 (step ST6). The output part 14 outputs the standard test vector data to the simulation unit 3. The simulation unit 3 executes simulation of the circuit subjected to inspection using the standard test vector data.

In a case that a fault occurs in the normal mode (a case of Yes in step ST5), the vector generator 13 executes the conversion programs 16-2 and converts the original standard test vector data to generate verification test vector data (step ST7). The output part 14 outputs the verification test vector data to the simulation unit 3 (step ST9). The simulation unit 3 executes simulation of the circuit subjected to inspection using the verification test vector data.

In a case of being judged as the reproduction mode in step ST2, the vector generator 13 applies the difference data of the activation log file 18 to the original standard test vector data to generate verification test vector data (step ST10). The output part 14 outputs the verification test vector data to the simulation unit 3 (step ST11). The simulation unit 3 executes simulation of the circuit subjected to inspection using the verification test vector data.

Although the above embodiments are examples of preferred embodiments of the present invention, the present invention is not limited to them but various modification or alternation can be made without departing from the scope of the present invention.

For example, the sequence definition file group 16 in FIGS. 3A and 3B or the sequence definition file group 16A in FIGS. 9A and 9B includes the conversion programs 16-2 that converts the original test vector data to generate a test vector generation program. Other than that, for example, the sequence definition file groups 16 and 16A may also include the conversion programs 16-2 and a plurality of conversion definition data items that are read by the conversion programs 16-2. Then, for example, differentiating the conversion definition data read by the conversion programs 16-2 in correspondence with the value of the random number data enables to generate a plurality of verification test vector data items corresponding to a plurality of input faults from one original test vector data item.

The conversion programs 16-2 may also be a program converting test vector data other than the standard test vector data.

In each of the embodiments described above, for the convenience of the description, one test vector file 5 and one pair of sequence definition file group 16 created by the designer are stored in the memory unit 4.

Other than that, for example, a plurality of test vector files 5 and a plurality of pairs of sequence definition file groups 16 created by the designer may also be stored in the memory unit 4 in an actual utilization.

In such a manner, even in a case of storing a plurality of test vector files 5 in the memory unit 4, from the plurality of test vector data items included in the plurality of test vector files 5, a plurality of test vector data items different from them can be generated, so that the number of test vector data items that a designer should create can be reduced.

Each of the embodiments described above, as illustrated in FIG. 1, is an example in a case that the circuit subjected to inspection is a circuit description program executed in the simulation unit 3. Other than that, for example, the circuit subjected to inspection may also be a manufactured circuit, for example a semiconductor device or the like.

Figure 10:
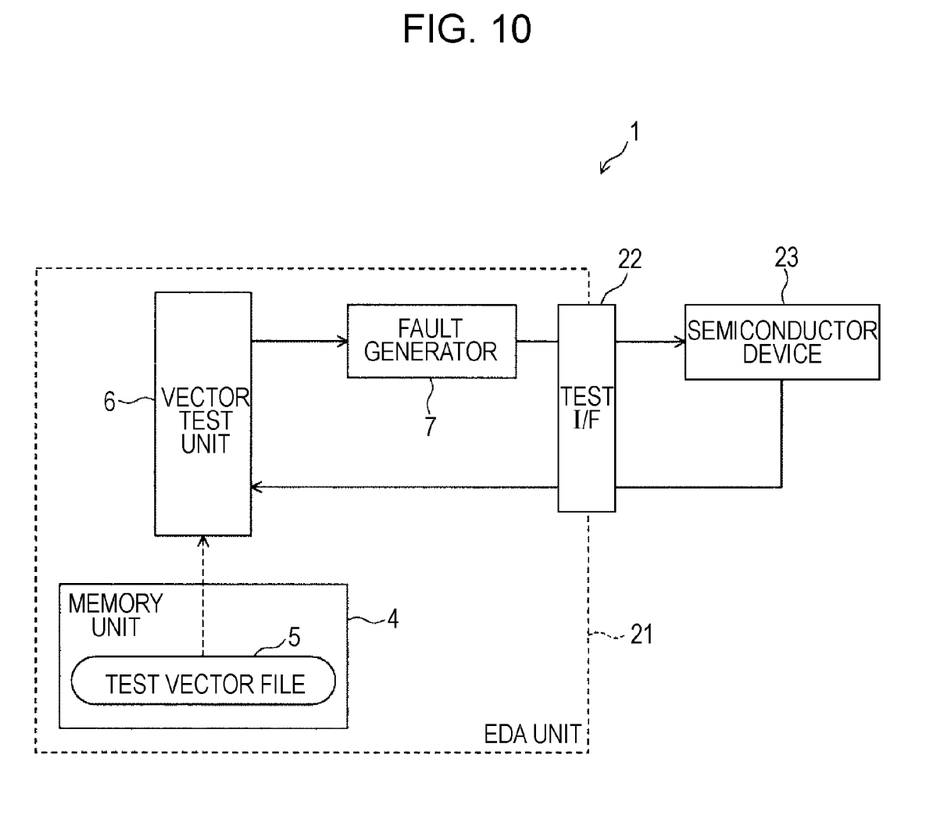
FIG. 10 is a schematic configuration diagram illustrating a testing apparatus according to a modification of an embodiment of the present invention.

FIG. 10 is a schematic configuration diagram illustrating a testing apparatus according to a modification of an embodiment of the present invention. A testing apparatus 1 is to inspect a manufactured semiconductor device 23, and has an EDA unit 21 with the functions same as the EDA unit 2 in FIG. 1 and a test I/F 22 connected to the semiconductor device 23.

The test I/F 22 outputs an output signal based on the test vector data outputted by the EDA unit 21 to the semiconductor device 23. The test I/F 22 also samples an input signal outputted by the semiconductor device 23 to generate output data. The test I/F 22 outputs the generated output data to the vector test unit 6.

With that, the testing apparatus 1 in FIG. 10 can execute verification similar to each of the embodiments described above for the manufactured semiconductor device 23.

In the testing apparatus 1, the test I/F 22 may be an interface provided for exclusive use of testing the semiconductor device 23 or may be a general purpose data input and output part of the testing apparatus 1.

The present application contains subject matter related to that disclosed in Japanese Priority Patent Application JP 2009-050278 filed in the Japan Patent Office on Mar. 4, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A testing apparatus comprising:
   a vector memory unit to store original test vector data in which an input signal to be inputted to a circuit subjected to inspection is described;
   a vector generator to generate, from the original test vector data stored in the vector memory unit, generated test vector data different from the original test vector data;
   an output part to output test vector data to be inputted to the circuit subjected to inspection;

a fault occurrence rate memory unit to store a fault occurrence rate of the input signal;
a random number generator to generate random number data; and
a comparison part to compare the fault occurrence rate of the input signal stored in the fault occurrence rate memory unit with the random number data;
wherein the vector output part outputs the generated test vector data in a case that the random number data is smaller than the fault occurrence rate of the input signal, and outputs the original test vector data in a case that the random number data is larger than the fault occurrence rate of the input signal;
further comprising a program memory unit to store a conversion program in which is described a conversion rule to generate verification test vector data from the standard test vector data, the verification test vector data describing an input signal different from the standard input signal that can be inputted to the circuit subjected to inspection, the standard test vector data describing the standard input signal to be inputted to the circuit subjected to inspection,
wherein the vector generator executes the conversion program to generate the generated test vector data from the original test vector data;
wherein the vector memory unit stores a plurality of items of the original test vector data in which a plurality of input signals to be inputted to the circuit subjected to inspection are described;
the fault occurrence rate memory unit stores, as a fault occurrence rate of the input signal described in one original test vector data item of the plurality of original test vector data items, a low fault occurrence rate in a case that no fault occurs in another original test vector data item and a high fault occurrence rate in a case that a fault occurs in the other original test vector data item; and
the comparison part compares the low fault occurrence rate with the random number data in a case that no fault occurs in the another original test vector data item, and compares the high fault occurrence rate with the random number data in a case that a fault occurs in the another original test vector data item.

2. The testing apparatus according to claim 1, wherein the vector memory unit stores standard test vector data in which a standard input signal to be inputted to the circuit subjected to inspection is described as the original test vector data.

3. The testing apparatus according to claim 1, wherein:
the vector memory unit stores the plurality of original test vector data items in which the plurality of input signals to be inputted to the circuit subjected to inspection are described;
the fault occurrence rate memory unit stores a plurality of fault occurrence rates for each input signal described in each of the original test vector data items corresponding respectively to the plurality of original test vector data items stored in the vector memory unit; and
the comparison part compares, for each of the original test vector data item, the fault occurrence rate of the input signal described therein with the random number data.

4. The testing apparatus according to claim 1, comprising a simulation unit to execute simulation of a circuit description program using the test vector data outputted from the output part as input data,
wherein the circuit subjected to inspection is described in the circuit description program.

5. A testing apparatus, comprising:
a vector memory unit to store original test vector data in which an input signal to be inputted to a circuit subjected to inspection is described;
a vector generator to generate, from the original test vector data stored in the vector memory unit, generated test vector data different from the original test vector data;
an output part to output test vector data to be inputted to the circuit subjected to inspection;
a fault occurrence rate memory unit to store a fault occurrence rate of the input signal;
a random number generator to generate random number data; and
a comparison part to compare the fault occurrence rate of the input signal stored in the fault occurrence rate memory unit with the random number data;
wherein the vector output part outputs the generated test vector data in a case that the random number data is smaller than the fault occurrence rate of the input signal, and outputs the original test vector data in a case that the random number data is larger than the fault occurrence rate of the input signal;
further comprising a program memory unit to store a conversion program in which is described a conversion rule to generate verification test vector data from the standard test vector data, the verification test vector data describing an input signal different from the standard input signal that can be inputted to the circuit subjected to inspection, the standard test vector data describing the standard input signal to be inputted to the circuit subjected to inspection,
wherein the vector generator executes the conversion program to generate the generated test vector data from the original test vector data;
wherein the vector memory unit stores a plurality of items of the original test vector data in which a plurality of input signals to be inputted to the circuit subjected to inspection are described;
the fault occurrence rate memory unit stores, as a fault occurrence rate of the input signal described in one original test vector data item of the plurality of original test vector data items, a low fault occurrence rate in a case that no fault occurs in another original test vector data item and a high fault occurrence rate in a case that a fault occurs in the other original test vector data item; and
the comparison part compares the low fault occurrence rate with the random number data in a case that no fault occurs in the another original test vector data item, and compares the high fault occurrence rate with the random number data in a case that a fault occurs in the another original test vector data item;
further comprising a reproduction data memory unit to accumulate and store reproduction data to reproduce the generated test vector data generated by the vector generator,
wherein the vector generator reproduces the generated test vector data from the original test vector data using the reproduction data stored in the reproduction data memory unit;
the reproduction data memory unit stores difference data, as the reproduction data, showing a point modified from the original test vector data for the generated test vector data; and the vector generator reproduces the generated test vector data by applying the reproduction data stored in the reproduction data memory unit to the original test vector data;

the reproduction data memory unit stores difference data, as the reproduction data, showing a point modified from the original test vector data for the generated test vector data; and the vector generator reproduces the generated test vector data by applying the reproduction data stored in the reproduction data memory unit to the original test vector data.

6. A testing method, comprising the steps of:

reading original test vector data, in which an input signal to be inputted to a circuit subjected to inspection is described, from a memory unit storing the original test vector data;

generating random number data;

reading a fault occurrence rate of the input signal corresponding to the read original test vector data from a memory unit storing the fault occurrence rate of the input signal;

comparing the generated random number data with the read fault occurrence rate of the input signal;

generating generated test vector data, different from the original test vector data, from the read original test vector data; and outputting test vector data to be inputted to the circuit subjected to inspection;

accumulating and storing reproduction data to reproduce the generated test vector data;

storing difference data, as the reproduction data, showing the point modified from the original test vector data for the generated test vector data, wherein the generated test vector data is reproduced by applying reproduction data to the original test vector data;

wherein in a case that the random number data is smaller than the fault occurrence rate of the input signal in the comparing step, the generated test vector data is generated in the generating step and the outputting step comprises outputting the generated test vector data, and wherein in a case that the random number data is larger than the fault occurrence rate of the input signal in the comparing step, the outputting step comprises outputting the original test vector data.

* * * * *